United States Patent [19]

Maeda

[11] Patent Number: 4,668,095
[45] Date of Patent: May 26, 1987

[54] POSITIONING DEVICE

[75] Inventor: Shuichi Maeda, Kyoto, Japan

[73] Assignee: DAC Engineering Co., Ltd., Kyoto, Japan

[21] Appl. No.: 663,921

[22] Filed: Oct. 23, 1984

[51] Int. Cl.[4] ............................................ G01B 11/00
[52] U.S. Cl. .................................................... 356/400
[58] Field of Search .............. 356/153, 154, 392, 393, 356/399–401, 388–391; 358/101

[56] References Cited

U.S. PATENT DOCUMENTS

| 2,460,350 | 2/1949 | Hinman | 356/393 |
| 3,560,093 | 2/1971 | Montone | 356/393 |
| 3,684,384 | 8/1972 | Hojo et al. | 356/399 |
| 3,889,056 | 6/1975 | Mayer, Jr. et al. | 356/392 |
| 4,037,969 | 7/1977 | Feldman et al. | 356/401 |
| 4,232,969 | 11/1980 | Wilczynski | 356/401 |

FOREIGN PATENT DOCUMENTS

| 2212159 | 9/1973 | Fed. Rep. of Germany | 356/390 |
| 0026835 | 2/1982 | Japan | 356/388 |
| 0368010 | 4/1973 | U.S.S.R. | 356/391 |

OTHER PUBLICATIONS

Culver et al., *IBM Technical Disclosure Bulletin*, vol. 17, No. 10, Mar. 1975, p. 2983.
Gaston et al., *IBM Technical Disclosure Bulletin*, vol. 25, No. 5, Oct. 1982.

Primary Examiner—F. L. Evans
Attorney, Agent, or Firm—Sughrue, Mion, Zinn, Macpeak and Seas

[57] ABSTRACT

A positioning device employing a single image pick-up device whereby two objects can be accurately aligned irrespective of inaccuracies in the pick-up device. The positioning device includes as a primary element an optical device composed of two prisms joined at oblique surfaces with a half-silvered mirror surface therebetween. The objects to be aligned are positioned adjacent first side surfaces of corresponding ones of the two prisms. A totally reflecting coating is provided on a second side surface of one of the two prisms, and an image pick-up device, namely, a video camera, is disposed to receive light emanating from the parallel second side surface of the other one of the two prisms. Alignment is effected in accordance with the output signal from the video camera.

1 Claim, 4 Drawing Figures

POSITIONING DEVICE

BACKGROUND OF THE INVENTION

The present invention relates to a positioning device for aligning the relative positions of two objects or patterns with a high accuracy Often it is desired to adjust the relative positions of two objects during a manufacturing operation using an industrial automatic assembly device or assembly robot. An example of such an operation is the mounting of an IC (Integrated Circuit) device on a printed substrate. In this operation, it is of course necessary that the two be accurately aligned Conventionally, to achieve alignment, it has been the practice to employ two video cameras, one for the IC circuit device and the other for the printed substrate. The outputs of the two video cameras are compared, and a signal representing the amount of misalignment derived therefrom which is then employed to align the two objects using a feedback servo circuit or the like.

However, in this system, there is inevitably some amount of error due to misalignment between the two video cameras and image distortion in their optical and electrical circuits. Accordingly, it is difficult to accurately align the two objects with a sufficiently high accuracy.

SUMMARY OF THE INVENTION

Accordingly it is a primary object of the present invention to provide a positioning device in which the foregoing drawbacks have been completely eliminated.

In accordance with the above and other objects, the invention provides a positioning device including two prisms joined to one another along their oblique surfaces with a half-silvered coating therebetween. Input light from the two objects to be aligned is received on parallel side surfaces of the respective prisms. An image pick-up device such as a video camera receives light from both of the objects reflected from the half-silvered coating between the oblique surfaces of the joined prisms. The output of this video camera is employed to accurately align the two objects.

DESCRIPTION OF THE PREFERRED EMBODIMENTS

Figure 1:
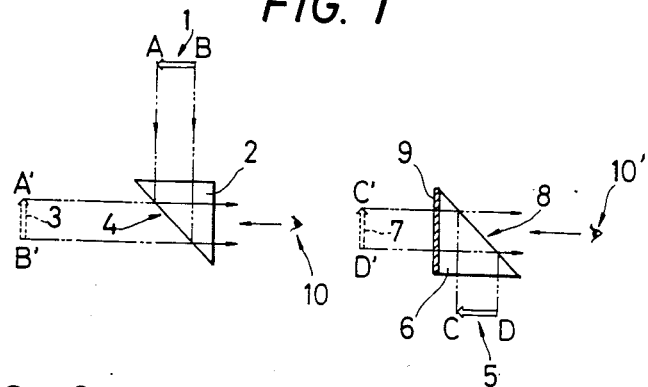
FIG. 1 is an explanatory view used for illustrating the principles of the present invention.

Referring now to FIG. 1, there is shown therein an explanatory view used to illustrate the principles of the present invention.

In FIG. 1, reference numeral 1 denotes a first object AB, and 5 denotes a second object CD. Two isosceles prisms 2 and 6 are provided having respective oblique surfaces 4 and 8, on each of which is provided a half-silvered coating. A totally reflecting coating 9 is provided on one side surface of the prism 6.

Light from the object 1 enters the upper side surface of the prism 2, which acts as one input surface, and is then reflected through an angle of 90° by the half-silvered coating 4, producing a virtual image A'B' as indicated at 3 which can be seen by an observer at a point 10. About one-half of the optical energy from the object 1 is reflected by the half-silvered coating 4 through the body of the prism 2 while the other half is reflected by the half-silvered coating 4 to form the virtual image A'B'.

The optical energy from the object CD enters through the lower side surface of the prism 6. About one-half of the energy thereof is reflected by the half-silvered coating 8 towards the totally reflecting coating 9. This optical energy is reflected by the totally reflecting coating 9 to provide a virtual image C'D' at 7 as seen by an observer at a point 10'.

Figure 2:
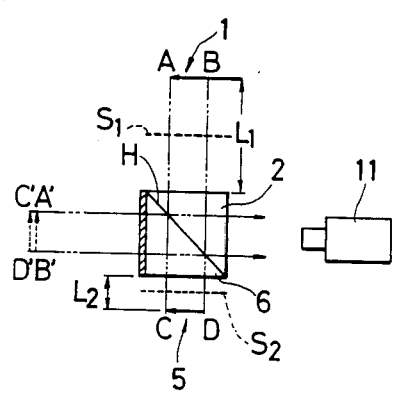
FIG. 2 is an explanatory diagram showing the arrangement of an optical device forming a primary component of a preferred embodiment of the invention.

A primary component of a positioning device of the present invention is an optical device as shown in FIG. 2 which takes advantage of the principles illustrated in FIG. 1. More specifically, as shown in FIG. 2 in which elements identified by like reference numerals and characters in FIG. 1 are similar, the two prisms 2 and 6 are joined at their oblique surfaces with a single half-silvered coating H therebetween. An image pick-up device (video camera) 11 is disposed at a viewing point adjacent the output surface of the optical device at one side surface of the prism 2. Further, shutters $S_1$ and and $S_2$ are disposed between the input surfaces of the respective prisms 2 and 6 and the objects 1 and 5.

As is apparent from the explanation above, images A'B' and C'D' are observable by the single video camera 11 in the same plane and in the same position when the two objects are properly aligned. To cause the virtual images A'B' and C'D' to appear in the same plane, because the optical path lengths in the prisms 2 and 6 are different, it is necessary to adjust the optical path lengths $L_1$ and $L_2$ between the objects 1 and 2 and the corresponding side surfaces of the respective prisms 2 and 6 appropriately.

To operate the device, the shutters $S_1$ and $S_2$ are opened in succession, whereupon virtual images A'B' and C'D' are individually sensed by the video camera 11. By storing these two video images and determining positional differences between the two images in the conventional manner, the amount of deviation from alignment between the two objects 1 and 5 can easily be determined.

Figure 4:
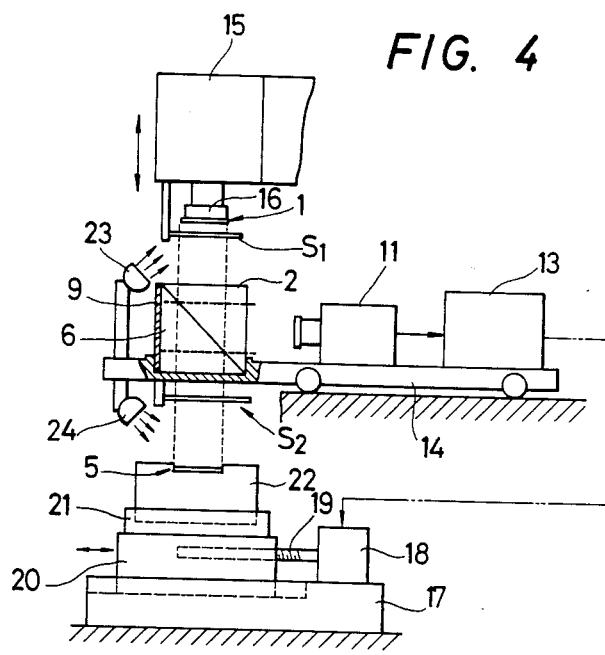
FIG. 4 is a schematic view illustrating a preferred embodiment of a positioning device of the invention.

Referring now to FIG. 4, a positioning device constructed in accordance with the teachings of the present invention will now be described. In FIG. 4, elements designated by the same reference numerals or characters as those in FIGS. 1 and 2 are similar.

The optical element composed of the prisms 2 and 6 and associated coatings as illustrated in FIG. 2 is disposed at a leftmost end of a movable table 14. Also disposed upon the movable table 14 is a video camera 11 and a conventional processing circuit 13, which may be a microcomputer or the like. Lamps 23 and 24 are disposed at the left end of the table 14 for illuminating the respective objects 1 and 5. In the illustrated embodiment, the object 1 is, for example, an IC circuit device held by a holder 16 attached to one end of a robot arm 15. The other object in this example is an IC circuit device mounting position on a printed substrate 22. The printed substrate 22 is mounted via a holder 21 to a movable bed 20, the position of which can be finely adjusted in the direction of an arrow while being guided along a guide groove formed in a stationary bed 17. A servo motor 18 is used to effect the positioning of the movable bed 20 via a screw feed mechanism.

The output from the image processing circuit 13, which is in the form of a deviation signal indicative of the amount of misalignment between the objects 1 and 5, is applied to the servo motor 18, which accordingly adjust the displacement of the movable bed 20. Therefore, the position of the printed substrate 22 is finely adjusted so that the IC circuit device and IC circuit device mounting position are properly aligned. When alignment occurs, the output from the circuit 13 becomes zero, whereupon the actuation of the servo motor 18 is halted. At this time, the table 14 is retracted rightwardly, and then the robot arm 18 is actuated so as to move the IC circuit device downwardly towards the mounting position 5.

The invention is of course not limited to a positioning system employing a servo motor as shown in FIG. 4. For example, control in cylindrical coordinate (X, Y, $\theta$) is also possible Moreover, it is not an essential condition that the optical device be constructed as a single unit as illustrated in FIG. 2; that is, the two prisms 2 and 6 can be separated if desired. Still further, it is not necessary for all applications to use a retractable table.

Figure 3:
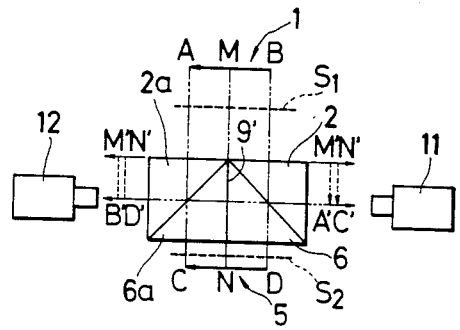
FIG. 3 is an explanatory view of a modified form of the optical device.

Referring now to FIG. 3, there is shown therein a modified form of the optical device which forms a primary element of the positioning device of the invention. In the embodiment of FIG. 3, prism pairs 2, 6 and 2a, 6a are disposed in a side-by-side relationship with a coating 9' which is totally reflecting on both sides disposed therebetween In this embodiment, the objects 1 and 5 are disposed relative to the optical device such that the points A and B at the opposite ends of the object 1 are separated by the optical device, as are the points C and D defining the two ends of the object 5. In FIG. 3, M and N represent the centers of the respective objects 1 and 5. Reference numeral 12 denotes a second video camera. Separated virtual images M'B', N'D', and M'A', N'C' are separately received by the respective video cameras 11 and 12. In this embodiment also, accurate alignment of the two objects can readily be achieved.

In the aforementioned embodiments, optical shutters $S_1$ and $S_2$ are provided. However, the provision of these shutters is not always necessary. For instance, it is possible to successively illuminate the two objects, thereby to obtain a similar result to that when the shutters are provided Furthermore, it is possible to input the images of the two objects simultaneously to the video camera and then to mathematically process the composite image to determine the amount of deviation from alignment. Still further, it is possible to eliminate the illuminating light sources when the objects themselves emit light. The objects are not limited to any specific shape, and objects of nearly any pattern or shape may be employed.

In the positioning device of the camera, because only a single video camera is required, the error present in the conventional systems due to misalignment and inherent errors in video cameras is eliminated, thereby significantly improving the positioning accuracy obtainable with the device. This makes it possible to use an industrial television (ITV) camera having a relatively large image distortion, thereby reducing the cost of the device. Moreover, if the amount of available optical energy is small, accurate positioning can nevertheless still be obtained by using a high-sensitivity image pick-up tube, which extends the industrial application of the device significantly. Moreover, the mounting of the pick-up device is greatly simplified with the use of the invention.

I claim:

1. A positioning device, comprising first and second optical devices, each of said optical devices comprising:
    first and second isosceles prisms having parallel oblique and adjacent surfaces and a half-silvered coating between said oblique surfaces;
    a first side surface, said first side surface having a coating totally reflecting on both sides thereof;
    second and third side surfaces, each of said second and third side surfaces being adjacent to said first side surface and parallel to one another; and
    a fourth side surface parallel to said first side surface,
    wherein said first side surfaces of said optical devices are disposed parallel to and facing one another, and objects to be aligned are disposed adjacent to said second and third side surfaces of each of said optical devices, respectively, said positioning device further comprising first and second image pick-up means disposed to receive light emanating from said fourth side surfaces of said first and second optical devices, respectively,
    wherein said first side surfaces of said optical devices are adjacent to one another.

* * * * *